(12) United States Patent
Kim et al.

(10) Patent No.: US 11,776,592 B2
(45) Date of Patent: Oct. 3, 2023

(54) SEMICONDUCTOR DEVICE INCLUDING PIPE LATCH CIRCUIT

(71) Applicant: SK hynix Inc., Icheon-si (KR)

(72) Inventors: Hyun Seung Kim, Icheon-si (KR); Ju Hyuck Kim, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 110 days.

(21) Appl. No.: 17/544,272

(22) Filed: Dec. 7, 2021

(65) Prior Publication Data

US 2023/0061738 A1 Mar. 2, 2023

(30) Foreign Application Priority Data

Aug. 31, 2021 (KR) ........................ 10-2021-0115970

(51) Int. Cl.
*G11C 7/10* (2006.01)
*G11C 11/4076* (2006.01)

(52) U.S. Cl.
CPC .......... *G11C 7/1039* (2013.01); *G11C 7/1051* (2013.01); *G11C 11/4076* (2013.01)

(58) Field of Classification Search
CPC .. G11C 7/1039; G11C 7/1051; G11C 11/4076
USPC .................................................. 365/189.05
See application file for complete search history.

(56) References Cited

U.S. PATENT DOCUMENTS

| | | | | |
|---|---|---|---|---|
| 2013/0044553 A1* | 2/2013 | Kwean | ................. | G11C 29/023 365/194 |
| 2019/0130949 A1* | 5/2019 | Kim | ..................... | G11C 7/1069 |
| 2021/0134335 A1* | 5/2021 | Lee | ..................... | G11C 11/4076 |

FOREIGN PATENT DOCUMENTS

| | | |
|---|---|---|
| KR | 1020060053431 A | 5/2006 |
| KR | 1020180068360 A | 6/2018 |

\* cited by examiner

*Primary Examiner* — Connie C Yoha
(74) *Attorney, Agent, or Firm* — WILLIAM PARK & ASSOCIATES LTD.

(57) ABSTRACT

A semiconductor device includes an input control signal generation circuit configured to generate an input control signal when performing an internal operation and configured to adjust a time point at which the input control signal is generated, based on whether a frequency of a clock corresponds to a preset frequency range. The semiconductor device includes an output control signal generation circuit configured to generate an output control signal after a latency elapses when performing the internal operation. The semiconductor device includes a pipe latch circuit configured to latch input data based on the input control signal and configured to output the latched input data as output data based on the output control signal.

20 Claims, 13 Drawing Sheets

FIG. 3

| | EN<1> OBI | EN<2> DATA COPY | EN<3> DSF | EN<4> BM | EN<5> LECC |
|---|---|---|---|---|---|
| LSS<1> | L | AT LEAST ONE 'H' | | | |
| LSS<2> | L | AT LEAST ONE 'H' | | | |
| LSS<3> | L | L | L | H | L |
| LSS<4> | L | L | L | L | H |
| LSS<5> | L | L | L | H | H |

FIG. 4

| CLOCK FREQUENCY | FREQUENCY RATIO <RTO> | LATENCY(LS) | | | | |
|---|---|---|---|---|---|---|
| | | SET_A (LSS<1>) | SET_B (LSS<2>) | SET_C (LSS<3>) | SET_D (LSS<4>) | SET_E (LSS<5>) |
| FIS<1> | 2:1 | 6 | 6 | 6 | 6 | 6 |
| FIS<2> | | 8 | 8 | 8 | 8 | 8 |
| FIS<3> | | 10 | 10 | 12 | 12 | 12 |
| ... | | ... | ... | ... | ... | ... |
| FIS<1> | 4:1 | 3 | 3 | 3 | 3 | 3 |
| FIS<2> | | 4 | 4 | 4 | 4 | 4 |
| FIS<3> | | 5 | 5 | 6 | 6 | 6 |
| ... | | ... | ... | ... | ... | ... |
| FIS<J-4> | | 15 | 16 | 17 | 17 | 18 |
| FIS<J-3> | | 16 | 17 | 19 | 18 | 20 |
| FIS<J-2> | | 17 | 18 | 20 | 19 | 21 |
| FIS<J-1> | | 20 | 22 | 24 | 23 | 24 |
| FIS<J> | | 23 | 25 | 26 | 26 | 28 |

FIG. 6

| CLOCK FREQUENCY | TCS | | | | |
|---|---|---|---|---|---|
| | SET_A(LSS<1>) | SET_B(LSS<2>) | SET_C(LSS<3>) | SET_D(LSS<4>) | SET_E(LSS<5>) |
| FIS<1> | - | - | - | - | - |
| FIS<2> | - | - | - | - | - |
| FIS<3> | - | - | - | - | - |
| ... | ... | ... | ... | ... | ... |
| FIS<J-4> | TCS<1> | TSC<1> | TCS<1> | TCS<1> | TCS<1> |
| FIS<J-3> | TCS<1> | TCS<1> | TCS<1> | TCS<1> | TCS<1> |
| FIS<J-2> | TCS<1> | TCS<1> | TCS<1> | TCS<1> | TCS<1> |
| FIS<J-1> | TCS<2> | TCS<2> | TCS<2> | TCS<2> | TCS<2> |
| FIS<J> | TCS<2> | TCS<2> | TCS<2> | TCS<2> | TCS<2> |

FIRST RANGE: FIS<J-4>, FIS<J-3>
THIRD RANGE: FIS<J-2>
SECOND RANGE: FIS<J-1>, FIS<J>

SEMICONDUCTOR DEVICE INCLUDING PIPE LATCH CIRCUIT

CROSS-REFERENCE TO RELATED APPLICATION

The present application claims priority under 35 U.S.C. § 119(a) to Korean application number 10-2021-0115970, filed in the Korean Intellectual Property Office on Aug. 31, 2021, the entire disclosure of which is incorporated herein by reference in its entirety.

BACKGROUND

1. Technical Field

The present disclosure relates to a semiconductor device including a pipe latch circuit.

2. Related Art

A semiconductor device may include a pipe latch circuit including a plurality of latch circuits in order to efficiently process signals transmitted therein. A signal processing scheme of the pipe latch circuit may be implemented in such a way to latch a signal input in synchronization with an input timing and output the latched signal in synchronization with an output timing.

SUMMARY

In an example, a semiconductor device may include: an input control signal generation circuit configured to generate an input control signal when performing an internal operation and configured to adjust a time point at which the input control signal is generated, based on whether a frequency of a clock corresponds to a preset frequency range; an output control signal generation circuit configured to generate an output control signal after a latency elapses when performing the internal operation; and a pipe latch circuit configured to latch input data based on the input control signal and configured to output the latched input data as output data based on the output control signal.

In an example, a semiconductor device may include: an input data generation circuit configured to generate input data when performing an internal operation and configured to adjust a time point at which the input data is generated, based on whether a frequency of a clock corresponds to a preset frequency range; a first latch circuit configured to generate first latch data by latching the input data based on a first bit of an input control signal and configured to output the first latch data as output data based on a first bit of an output control signal; and a second latch circuit configured to generate second latch data by latching the input data based on a second bit of the input control signal and configured to output the second latch data as the output data based on a second bit of the output control signal.

BRIEF DESCRIPTION OF THE DRAWINGS

FIG. 3 is a table for explaining the operation of the latency set information signal generation circuit illustrated in FIG. 2.

FIG. 4 is a table for explaining the operation of a latency signal generation circuit illustrated in FIG. 1.

FIG. 6 is a table for explaining the operation of the timing control signal generation circuit illustrated in FIG. 5.

DETAILED DESCRIPTION

In the following descriptions of embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through still another component interposed therebetween. On the other hand, when one component is referred to as being "directly coupled" or "directly connected" to another component, it should be understood that the components are directly coupled or connected to each other without still another component interposed therebetween.

"Logic high level" and "logic low level" are used to describe the logic levels of signals. A signal with "logic high level" is distinguished from a signal with "logic low level." For example, when a signal with a first voltage corresponds to a signal with a "logic high level," a signal with a second voltage may correspond to a signal with a "logic low level." According to an embodiment, a "logic high level" may be set to a voltage higher than a "logic low level." According to an embodiment, the logic levels of signals may be set to different logic levels or opposite logic levels. For example, a signal with a logic high level may be set to have a logic low level according to an embodiment, and a signal with a logic low level may be set to have a logic high level according to an embodiment.

Hereafter, the teachings of the present disclosure will be described in more detail through embodiments. These embodiments are only used to exemplify the teachings of the present disclosure, and the scope of protection of the present disclosure is not limited by the embodiments.

Some examples of the present disclosure are directed to a semiconductor device including a pipe latch circuit.

According to the examples of the present disclosure, when a time point at which data that is latched in a pipe latch circuit is output is changed based on a clock frequency, by adjusting a time point at which data is input to the pipe latch circuit, according to whether the clock frequency corresponds to a preset frequency range, it is possible to prevent overwriting regardless of clock frequency, and it is possible to reduce an output loading that increases as the number of latch circuits included in the pipe latch circuit increases.

Figure 1:
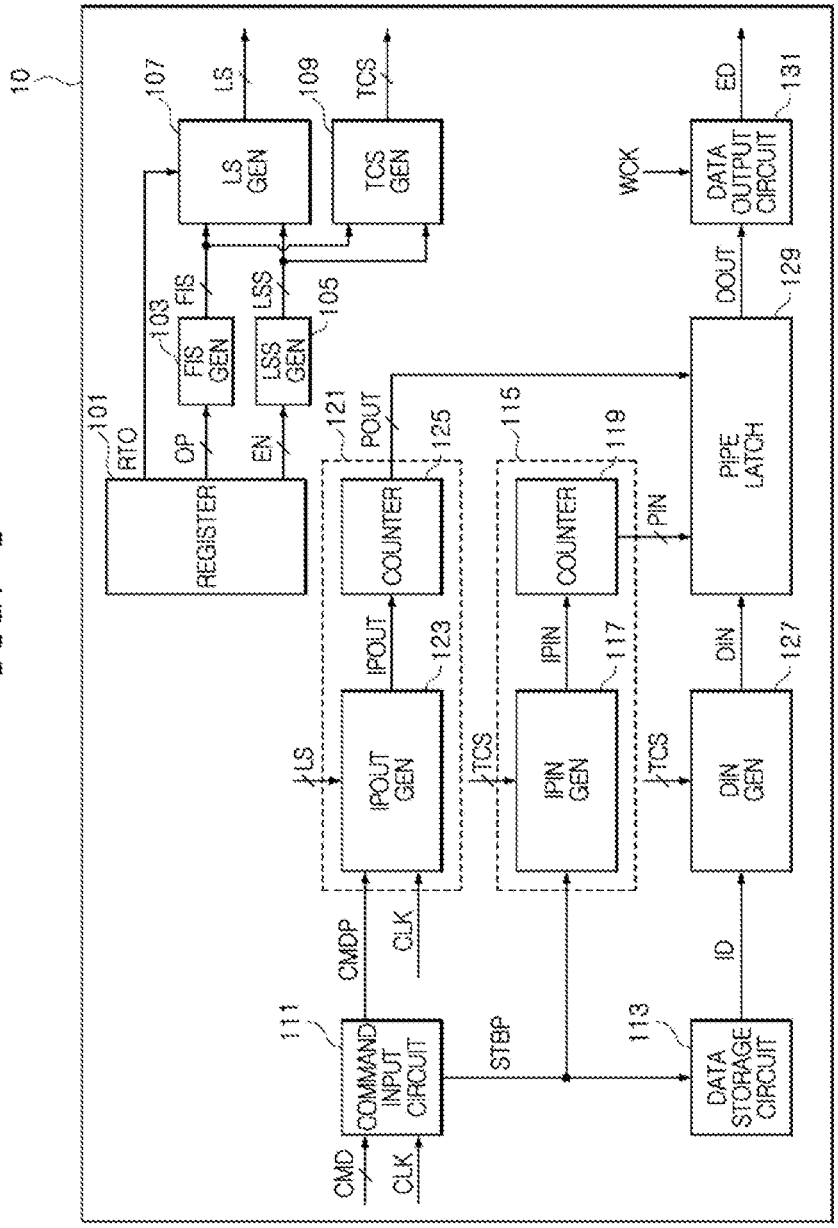
FIG. 1 is a block diagram illustrating a configuration of a semiconductor device in accordance with an example of the present disclosure.

FIG. 1 is a block diagram illustrating the configuration of a semiconductor device 10 in accordance with an example of the present disclosure. As illustrated in FIG. 1, the semiconductor device 10 may include a register circuit (REGISTER) 101, a frequency information signal generation circuit (FIS GEN) 103, a latency set information signal generation circuit (LSS GEN) 105, a latency signal generation circuit (LS GEN) 107, a timing control signal generation circuit (TCS GEN) 109, a command input circuit (COMMAND INPUT CIRCUIT) 111, a data storage circuit (DATA STORAGE CIRCUIT) 113, an input control signal generation circuit 115, an output control signal generation circuit 121, an input data generation circuit (DIN GEN) 127, a pipe latch circuit (PIPE LATCH) 129 and a data output circuit (DATA OUTPUT CIRCUIT) 131. In the present embodiment, the semiconductor device 10 may be implemented with a memory device. The semiconductor device 10 may be applied with a command CMD, a clock CLK, and a data clock WCK from an external device (not illustrated) and may perform various internal operations, including a write operation and a read operation. The present embodiment describes an example in which the semiconductor device 10 performs the read operation among the various internal operations.

The register circuit 101 may store and output a frequency information code OP, a frequency ratio information signal RTO, and a mode enable signal EN. The register circuit 101 may receive and store information regarding the frequency information code OP, the frequency ratio information signal RTO, and the mode enable signal EN from the external device (not illustrated). The frequency information code OP may have information regarding the frequency of the clock CLK. For example, the frequency information code OP may have a first logic level combination when the frequency of the clock CLK is a first frequency. The frequency information code OP may have a second logic level combination when the frequency of the clock CLK is a second frequency. The frequency ratio information signal RTO may indicate the ratio between the frequency of the clock CLK and the frequency of the data clock WCK. For example, the frequency ratio information signal RTO may have a first logic level when the ratio between the frequency of the clock CLK and the frequency of the data clock WCK is 1:2. The frequency ratio information signal RTO may have a second logic level when the ratio between the frequency of the clock CLK and the frequency of the data clock WCK is 1:4. The first logic level and the second logic level may be set to a logic high level and a logic low level, respectively. According to an embodiment, the first logic level and the second logic level may be set to a logic low level and a logic high level, respectively. The mode enable signal EN may include a plurality of signals. Each mode enable signal EN may be activated to perform a mode that is related to at least one of data calculation, data error information transmission, and data transfer in an internal operation.

The frequency information signal generation circuit 103 may generate a frequency information signal FIS by decoding the frequency information code OP. The frequency information signal FIS may include first to Jth frequency information signals FIS<1:J>. The first to Jth frequency information signals FIS<1:J> may indicate different frequencies, respectively, of the clock CLK. For example, the first frequency information signal FIS<1> may be activated to indicate that the frequency of the clock CLK is the first frequency. The second frequency information signal FIS<2> may be activated to indicate that the frequency of the clock CLK is the second frequency.

The latency set information signal generation circuit 105 may generate a latency set information signal LSS indicating a latency set by decoding the mode enable signal EN. The latency set may include first, second, third, fourth, and fifth latency sets. The latency set means a latency group that is determined based on whether modes that are enabled by the mode enable signal EN are performed. The configuration and operation method of the latency set information signal generation circuit 105 will be described later in detail with reference to FIG. 2.

The latency signal generation circuit 107 may generate a latency signal LS indicating a latency based on the frequency information signal FIS, the frequency ratio information signal RTO, and the latency set information signal LSS. The latency signal generation circuit 107 may generate the latency signal LS for a latency that is changed based on the frequency of the clock CLK, the frequency ratio between the clock CLK and the data clock WCK, and the latency set. The latency may increase when the frequency of the clock CLK is high. In the present embodiment, the latency means a read latency that is required to output data to an external device when the semiconductor device 10 is applied with the command CMD for the read operation. The operation for the latency signal generation circuit 107 to generate the latency signal LS will be described later in detail with reference to FIG. 4.

The timing control signal generation circuit 109 may generate an input timing control signal TCS based on whether the frequency of the clock CLK corresponds to a preset frequency range and the latency set based on the clock frequency information signal FIS and the latency set information signal LSS. The preset frequency range may include a first frequency range, a second frequency range, and a third frequency range. The second frequency range may be set higher than the first frequency range. The third frequency range may be set between the first frequency range and the second frequency range. The input timing control signal TCS may include a first input timing control signal TCS<1> and a second input timing control signal TCS<2>.

The timing control signal generation circuit 109 may activate the input timing control signal TCS when the frequency of the clock CLK that is indicated by the frequency information signal FIS corresponds to the preset frequency range. For example, the timing control signal generation circuit 109 may activate the first input timing control signal TCS<1> when the frequency of the clock CLK that is indicated by the frequency information signal FIS corresponds to the first frequency range. The timing control signal generation circuit 109 may activate the second input timing control signal TCS<2> when the frequency of the clock CLK that is indicated by the frequency information signal FIS corresponds to the second frequency range. The timing control signal generation circuit 109 may activate one of the first input timing control signal TCS<1> and the second input timing control signal TCS<2> based on the latency set that is indicated by the latency set information signal LSS. For example, when the frequency of the clock CLK that is indicated by the frequency information signal FIS corresponds to the third frequency range, the timing control signal generation circuit 109 may activate the first input timing control signal TCS<1> when the latency set that is indicated by the latency set information signal LSS is one of the first and the second latency sets. When the frequency of the clock CLK that is indicated by the frequency information signal FIS corresponds to the third frequency range, the timing control signal generation circuit 109 may activate the second input timing control signal TCS<2> when the latency set that is indicated by the latency set information signal LSS is one of the third, fourth and fifth latency sets. The configuration and operation method of the timing control signal generation circuit 109 will be described later in detail with reference to FIG. 5.

The command input circuit 111 may generate a command pulse CMDP and a strobing pulse STBP from the command CMD in synchronization with the clock CLK. The command input circuit 111 may sequentially generate the command pulse CMDP and the strobing pulse STBP by decoding the command CMD for the internal operation. The number of bits of the command CMD may be variously set based on an embodiment.

The data storage circuit 113 may include a plurality of cell arrays that store internal data ID. When the strobing pulse STBP is input, the data storage circuit 113 may output the internal data ID stored in a cell array.

The input control signal generation circuit 115 may include an internal input control signal generation circuit (IPIN GEN) 117 and a first count circuit (COUNTER) 119. When performing the internal operation, the input control signal generation circuit 115 may generate an input control signal PIN from the strobing pulse STBP based on the input timing control signal TCS.

When performing the internal operation, the input control signal generation circuit 115 may adjust a time point at which the input control signal PIN is generated from the strobing pulse STBP based on whether the frequency of the clock CLK corresponds to the preset frequency range and based on the input timing control signal TCS. When the input timing control signal TCS is activated, the input control signal generation circuit 115 may generate the input control signal PIN by further delaying the strobing pulse STBP by an input delay period. On the other hand, when the input timing control signal TCS is deactivated, the strobing pulse STBP is not delayed by the input delay period. The input delay period may include a first input delay period and a second input delay period. The second input delay period may be set to be larger than the first input delay period. In more detail, when the first input timing control signal TCS<1> is activated, the input control signal generation circuit 115 may generate the input control signal PIN by further delaying the strobing pulse STBP by the first input delay period. On the other hand, when the input timing control signal TCS is deactivated, the strobing pulse STBP is not delayed by the first input delay period. When the second input timing control signal TCS<2> is activated, the input control signal generation circuit 115 may generate the input control signal PIN by further delaying the strobing pulse STBP by the second input delay period. On the other hand, when the input timing control signal TCS is deactivated, the strobing pulse STBP is not delayed by the second input delay period. That is to say, the input control signal generation circuit 115 may adjust the input delay period to a larger degree when the second input timing control signal TCS<2> is activated than when the first input timing control signal TCS<1> is activated.

The input control signal generation circuit 115 may sequentially activate first to Nth bits PIN<1:N> of the input control signal PIN by counting the input of the strobing pulse STBP for the internal operation (N is a natural number equal to or greater than 2). For example, when the strobing pulse STBP is input for the first time, the input control signal generation circuit 115 may activate the first bit PIN<1> of the input control signal PIN. When the strobing pulse STBP is input for the Nth time, the input control signal generation circuit 115 may activate the Nth bit PIN<N> of the input control signal PIN. Thereafter, when the strobing pulse STBP is input for the (N+1)th time, the input control signal generation circuit 115 may activate the first bit PIN<1> of the input control signal PIN again.

The internal input control signal generation circuit 117 may generate an internal input control signal IPIN from the strobing pulse STBP based on the input timing control signal TCS. When the input timing control signal TCS is deactivated, the internal input control signal generation circuit 117 may output the internal input control signal IPIN by buffering the strobing pulse STBP. When the input timing control signal TCS is activated, the internal input control signal generation circuit 117 may output the internal input control signal IPIN by delaying the strobing pulse STBP by the input delay period. For example, when the first input timing control signal TCS<1> is activated, the internal input control signal generation circuit 117 may output the internal input control signal IPIN by delaying the strobing pulse STBP by the first input delay period. When the second input timing control signal TCS<2> is activated, the internal input control signal generation circuit 117 may output the internal input control signal IPIN by delaying the strobing pulse STBP by the second input delay period. The configuration and operation method of the internal input control signal generation circuit 117 will be described later in detail with reference to FIGS. 7 and 8.

The first count circuit 119 may sequentially activate the first to Nth bits PIN<1:N> of the input control signal PIN by counting the input of the internal input control signal IPIN. For example, when the internal input control signal IPIN is input for the first time, the first count circuit 119 may activate the first bit PIN<1> of the input control signal PIN. When the internal input control signal IPIN is input for the Nth time, the first count circuit 119 may activate the Nth bit PIN<N> of the input control signal PIN. Thereafter, when the internal input control signal IPIN is input for the (N+1)th time, the first count circuit 119 may activate the first bit PIN<1> of the input control signal PIN again.

The output control signal generation circuit 121 may include an internal output control signal generation circuit (IPOUT GEN) 123 and a second count circuit (COUNTER) 125. When performing the internal operation, the output control signal generation circuit 121 may generate an output control signal POUT from the command pulse CMDP based on the latency signal LS in synchronization with the clock CLK.

When performing the internal operation, the output control signal generation circuit 121 may generate the output control signal POUT after a latency elapses based on the latency signal LS. When performing the internal operation, the output control signal generation circuit 121 may generate the output control signal POUT by delaying the command pulse CMDP by a latency, indicated by the latency signal LS, in synchronization with the clock CLK.

The output control signal generation circuit 121 may sequentially activate first to Nth bits POUT<1:N> of the output control signal POUT by counting the input of the command pulse CMDP for the internal operation. For example, when the command pulse CMDP is input for the first time, the output control signal generation circuit 121 may activate the first bit POUT<1> of the output control signal POUT. When the command pulse CMDP is input for the Nth time, the output control signal generation circuit 121 may activate the Nth bit POUT<N> of the output control signal POUT. Thereafter, when the command pulse CMDP is input for the (N+1)th time, the output control signal generation circuit 121 may activate the first bit POUT<1> of the output control signal POUT again.

The internal output control signal generation circuit 123 may generate an internal output control signal IPOUT from the command pulse CMDP based on the latency signal LS in synchronization with the clock CLK. The internal output control signal generation circuit 123 may output the internal output control signal IPOUT by delaying the command pulse CMDP by a latency, indicated by the latency signal LS, in synchronization with the clock CLK.

The second count circuit 125 may sequentially activate the first to Nth bits POUT<1:N> of the output control signal POUT by counting the input of the internal output control signal IPOUT. For example, when the internal output control signal IPOUT is input for the first time, the second count circuit 125 may activate the first bit POUT<1> of the output control signal POUT. When the internal output control signal IPOUT is input for the Nth time, the second count circuit 125 may activate the Nth bit POUT<N> of the output control signal POUT. Thereafter, when the internal output control signal IPOUT is input for the (N+1)th time, the second count circuit 125 may activate the first bit POUT<1> of the output control signal POUT again.

When performing the internal operation, the input data generation circuit 127 may generate input data DIN from the internal data ID based on the input timing control signal TCS. When performing the internal operation, the input data generation circuit 127 may adjust a time point at which the input data DIN is generated from the internal data ID based on whether the frequency of the clock CLK corresponds to the preset frequency range and based on the input timing control signal TCS. When the input timing control signal TCS is activated, the input data generation circuit 127 may generate the input data DIN by further delaying the internal data ID by an input delay period. On the other hand, when the input timing control signal TCS is deactivated, the internal data ID is not delayed by the input delay period. In more detail, when the first input timing control signal TCS<1> is activated, the input data generation circuit 127 may generate the input data DIN by further delaying the internal data ID by a first input delay period. On the other hand, when the input timing control signal TCS is deactivated, the internal data ID is not delayed by the first input delay period. When the second input timing control signal TCS<2> is activated, the input data generation circuit 127 may generate the input data DIN by further delaying the internal data ID by a second input delay period. On the other hand, when the input timing control signal TCS is deactivated, the internal data ID is not delayed by the second input delay period. That is to say, the input data generation circuit 127 may adjust the input delay period to a larger degree when the second input timing control signal TCS<2> is activated than when the first input timing control signal TCS<1> is activated.

The input data generation circuit 127 may output the input data DIN by buffering the internal data ID when the input timing control signal TCS is deactivated. The input data generation circuit 127 may output the input data DIN by delaying the internal data ID when the input timing control signal TCS is activated. For example, when the first input timing control signal TCS<1> is activated, the input data generation circuit 127 may output the input data DIN by delaying the internal data ID by the first input delay period. When the second input timing control signal TCS<2> is activated, the input data generation circuit 127 may output the input data DIN by delaying the internal data ID by the second input delay period. The configuration and operation method of the input data generation circuit 127 will be described later in detail with reference to FIGS. 9 and 10.

The pipe latch circuit 129 may output output data DOUT by latching the input data DIN based on the input control signal PIN and the output control signal POUT. The pipe latch circuit 129 may include a plurality of latch circuits 241_1 to 241_N (see FIG. 11). The pipe latch circuit 129 may latch the input data DIN when the input control signal PIN is activated. For example, when the Nth bit PIN<N> of the input control signal PIN is activated, the pipe latch circuit 129 may generate the Nth latch data (not illustrated) by latching the input data DIN in the Nth latch circuit 241_N (see FIG. 11). The pipe latch circuit 129 may output the latched input data DIN as the output data DOUT when the output control signal POUT is activated. For example, when the Nth bit POUT<N> of the output control signal POUT is activated, the pipe latch circuit 129 may output the Nth latch data (not illustrated) in the Nth latch circuit 241_N (see FIG. 11) as the output data DOUT. In the pipe latch circuit 129, when the frequency of the clock CLK is high, a time point at which the output data DOUT is output may be delayed by the output control signal POUT that is generated after a latency elapses in the internal operation. In the pipe latch circuit 129, a time point at which the input data DIN is input may be adjusted by the input control signal PIN based on whether the frequency of the clock CLK corresponds to the preset frequency range. Accordingly, the pipe latch circuit 129 may prevent a phenomenon that the input data DIN is overwritten to one of the plurality of latch circuits 241_1 to 241_N (see FIG. 11) when the frequency of the clock CLK is high. In addition, by preventing the overwrite phenomenon without increasing the number of the plurality of latch circuits 241_1 to 241_N that are included in the pipe latch circuit 129, it is possible to reduce the output loading of the output data DOUT that increases as the number of the plurality of latch circuits 241_1 to 241_N increases. The configuration and operation method of the pipe latch circuit 129 will be described later in detail with reference to FIG. 11.

When performing the internal operation, the data output circuit 131 may output the output data DOUT as external data ED in synchronization with the data clock WCK. When performing the internal operation, the external data ED may be transmitted to the external device (not illustrated).

Figure 2:
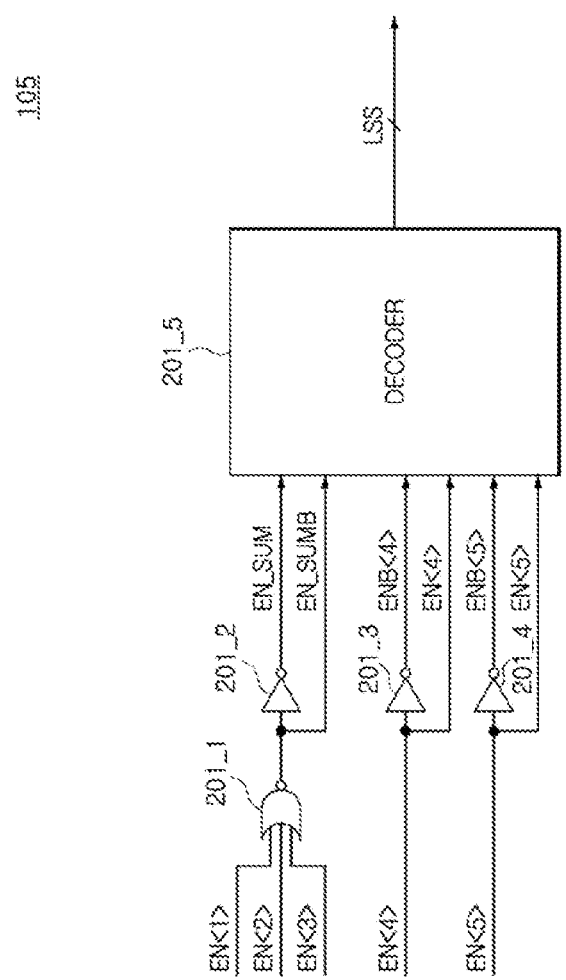
FIG. 2 is a diagram illustrating an example of a latency set information signal generation circuit illustrated in FIG. 1.

FIG. 2 is a diagram illustrating an example of the latency set information signal generation circuit 105 illustrated in FIG. 1. As illustrated in FIG. 2, the latency set information signal generation circuit 105 may include a NOR gate 201_1, inverters 201_2, 201_3 and 201_4 and a decoder (DECODER) 201_5.

The latency set information signal generation circuit 105 may generate the latency set information signal LSS indicating the latency set, from first to fifth mode enable signals EN<1:5>. Each of the first to fifth mode enable signals EN<1:5> may be activated to perform a mode that is related to at least one of data calculation, data error information transmission, and data transfer in the internal operation. For example, the first mode enable signal EN<1> may be activated to perform a data bus inversion (DBI) mode that calculates the number of bits with '1', among bits that are included in the data in the internal operation, and inverting the bits that are included in the data when the number of bits with '1' is equal to or greater than a preset number. The second mode enable signal EN<2> may be activated to perform a data copy mode that calculates whether values of the bits that are included in the data in the internal operation are the same and transmitting only values of some bits when the values of the bits included in the data are the same. The third mode enable signal EN<3> may be activated to perform a decoding status flag (DSF) mode of transmitting information regarding the number of bits in which errors occurred, among the bits that are included in data in the internal operation. The fourth mode enable signal EN<4> may be activated to perform a byte mode (BM) to transfer data that is loaded on a data transmission line to another data transmission line in the internal operation. The fifth mode enable signal EN<5> may be activated to perform a link ECC (LECC) mode to perform an exclusive logic operation on bits that are included in the data to generate a parity in the internal operation.

The NOR gate 201_1 may receive the first, second, and third mode enable signals EN<1>, EN<2>, and EN<3>, may perform a NOR logic operation thereon, and may generate an inverted sum enable signal EN_SUMB. The inverter 201_2 may invert and buffer the inverted sum enable signal EN_SUMB, and may output a sum enable signal EN_SUM. The inverter 201_3 may invert and buffer the fourth mode enable signal EN<4> and may output an inverted fourth mode enable signal ENB<4>. The inverter 201_4 may invert and buffer the fifth mode enable signal EN<5> and may output an inverted fifth mode enable signal ENB<5>. The decoder 201_5 may decode the sum enable signal EN_SUM, the inverted sum enable signal EN_SUMB, the fourth mode enable signal EN<4>, the inverted fourth mode enable signal ENB<4>, the fifth mode enable signal EN<5> and the inverted fifth mode enable signal ENB<5>, and may output the latency set information signal LSS indicating the latency set.

FIG. 3 is a table for explaining the operation of the latency set information signal generation circuit 105, illustrated in FIG. 2. As illustrated in FIG. 3, the latency set information signal LSS may include first to fifth latency set information signals LSS<1:5>. The first to fifth latency set information signals LSS<1:5> may indicate the first to fifth latency sets, respectively. The mode enable signal EN may be deactivated when the mode enable signal EN has a logic low level 'L' and may be activated when the mode enable signal EN has a logic high level 'H.'

When all of the mode enable signals EN are deactivated in the internal operation, the latency set information signal generation circuit 105 may activate the first latency set information signal LSS<1> indicating the first latency set.

When, in the internal operation, at least one of the data bus inversion (DBI) mode, the data copy mode, and the decoding status flag (DSF) mode is performed and the byte mode (BM) is not performed, the latency set information signal generation circuit 105 may activate the second latency set information signal LSS<2> indicating the second latency set.

When, in the internal operation, at least one of the data bus inversion (DBI) mode, the data copy mode, and the decoding status flag (DSF) mode is performed and the byte mode (BM) is also performed, the latency set information signal generation circuit 105 may activate the third latency set information signal LSS<3> indicating the third latency set.

When, in the internal operation, the link ECC (LECC) mode is performed and the byte mode (BM) is not performed, the latency set information signal generation circuit 105 may activate the fourth latency set information signal LSS<4> indicating the fourth latency set.

When, in the internal operation, the link ECC (LECC) mode and the byte mode (BM) are performed, the latency set information signal generation circuit 105 may activate the fifth latency set information signal LSS<5> indicating the fifth latency set.

FIG. 4 is a table for explaining the operation of the latency signal generation circuit 107 illustrated in FIG. 1. The latency signal generation circuit 107 may generate the latency signal LS indicating a latency, based on the frequency information signal FIS, the frequency ratio information signal RTO and the latency set information signal LSS. The first to Jth frequency information signals FIS<1:J> may indicate different frequencies, respectively, of the clock CLK. The frequency ratio information signal RTO may indicate the ratio between the frequencies of the data clock WCK and the clock CLK. The first to fifth latency set information signals LSS<1:5> may indicate a first latency set SET_A, a second latency set SET_B, a third latency set SET_C, a fourth latency set SET_D, and a fifth latency set SET_E, respectively. The latency signal LS may indicate how many cycles of the clock CLK a latency corresponds to.

When the frequency ratio information signal RTO indicates that the frequency ratio between the data clock WCK and the clock CLK is 2:1 and the latency set information signal LSS indicates the first latency set SET_A, the latency signal generation circuit 107 may generate the latency signal LS indicating that a latency corresponds to six cycles of the clock CLK, based on the first frequency information signal FIS<1> indicating the first frequency. When the frequency ratio information signal RTO indicates that the frequency ratio between the data clock WCK and the clock CLK is 2:1 and the latency set information signal LSS indicates the first latency set SET_A, the latency signal generation circuit 107 may generate the latency signal LS indicating that a latency corresponds to eight cycles of the clock CLK, based on the second frequency information signal FIS<2> indicating the second frequency. By this fact, it may be confirmed that a latency is changeable based on the frequency of the clock CLK.

When the frequency ratio information signal RTO indicates that the frequency ratio between the data clock WCK and the clock CLK is 2:1 and the latency set information signal LSS indicates the first latency set SET_A, the latency signal generation circuit 107 may generate the latency signal LS indicating that a latency corresponds to six cycles of the clock CLK, based on the first frequency information signal FIS<1> indicating the first frequency. When the frequency ratio information signal RTO indicates that the frequency ratio between the data clock WCK and the clock CLK is 4:1 and the latency set information signal LSS indicates the first latency set SET_A, the latency signal generation circuit 107 may generate the latency signal LS indicating that a latency corresponds to three cycles of the clock CLK, based on the first frequency information signal FIS<1> indicating the first frequency. By this fact, it may be confirmed that a latency is changeable based on the frequency ratio between the data clock WCK and the clock CLK.

When the frequency ratio information signal RTO indicates that the frequency ratio between the data clock WCK and the clock CLK is 2:1 and the latency set information signal LSS indicates the first latency set SET_A, the latency signal generation circuit 107 may generate the latency signal LS indicating that a latency corresponds to 10 cycles of the clock CLK, based on the third frequency information signal FIS<3> indicating a third frequency. When the frequency ratio information signal RTO indicates that the frequency ratio between the data clock WCK and the clock CLK is 2:1 and the latency set information signal LSS indicates the third latency set SET_C, the latency signal generation circuit 107 may generate the latency signal LS indicating that a latency corresponds to 12 cycles of the clock CLK, based on the third frequency information signal FIS<3> indicating the third frequency. By this fact, it may be confirmed that a latency is changeable based on the latency set.

Figure 5:
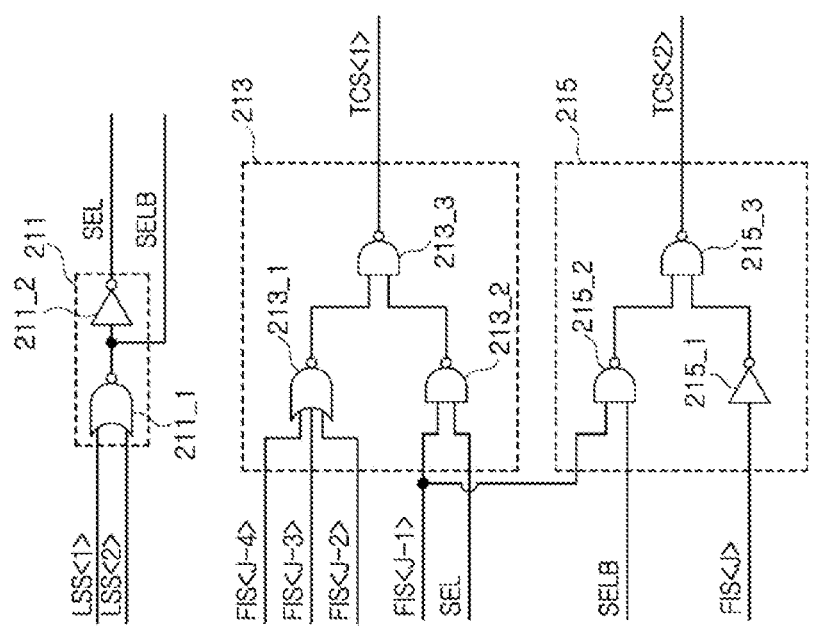
FIG. 5 is a circuit diagram illustrating an example of a timing control signal generation circuit illustrated in FIG. 1.

FIG. 5 is a circuit diagram illustrating an example of the timing control signal generation circuit 109 illustrated in FIG. 1. As illustrated in FIG. 5, the timing control signal generation circuit 109 may include a selection signal generation circuit 211, a first timing control signal generation circuit 213 and a second timing control signal generation circuit 215.

The selection signal generation circuit 211 may generate a selection signal SEL and an inverted selection signal SELB based on whether the latency set is a preset latency set and based on the latency set information signal LSS. The selection signal SEL may be activated when the latency set that is indicated by the latency set information signal LSS is the preset latency set. The inverted selection signal SELB may be activated when the latency set that is indicated by the latency set information signal LSS is different from the preset latency set. For example, in the case in which the preset latency set is the first and second latency sets, the selection signal generation circuit 211 may activate the selection signal SEL and deactivate the inverted selection signal SELB when one of the first and second latency set information signals LSS<1:2> is input. The selection signal generation circuit 211 may be implemented with a NOR gate 211_1 and an inverter 211_2.

The first timing control signal generation circuit 213 may generate the first input timing control signal TCS<1> based on the selection signal SEL and the frequency information signal FIS. When the frequency of the clock CLK (see FIG. 1) that is indicated by the frequency information signal FIS corresponds to the preset first frequency range, the first timing control signal generation circuit 213 may activate the first input timing control signal TCS<1>. For example, when one of the frequency information signals FIS<J-4>, FIS<J-3>, and FIS<J-2> that correspond to the first frequency range is input, the first timing control signal generation circuit 213 may activate the first input timing control signal TCS<1>. When the frequency of the clock CLK that is indicated by the frequency information signal FIS corresponds to the preset third frequency range and the selection signal SEL is activated, the first timing control signal generation circuit 213 may activate the first input timing control signal TCS<1>. For example, when the frequency information signal FIS<J-1> corresponding to the third frequency range is input and the selection signal SEL is activated, the first timing control signal generation circuit 213 may activate the first input timing control signal TCS<1>. The first timing control signal generation circuit 213 may be implemented with a NOR gate 213_1 and NAND gates 213_2 and 213_3.

The second timing control signal generation circuit 215 may generate the second input timing control signal TCS<2> based on the inverted selection signal SELB and the frequency information signal FIS. When the frequency of the clock CLK (see FIG. 1) that is indicated by the frequency information signal FIS corresponds to the preset second frequency range, the second timing control signal generation circuit 215 may activate the second input timing control signal TCS<2>. For example, when the frequency information signal FIS<J> that corresponds to the second frequency range is input, the second timing control signal generation circuit 215 may activate the second input timing control signal TCS<2>. When the frequency of the clock CLK that is indicated by the frequency information signal FIS corresponds to the preset third frequency range and the inverted selection signal SELB is activated, the second timing control signal generation circuit 215 may activate the second input timing control signal TCS<2>. For example, when the frequency information signal FIS<J-1> corresponding to the third frequency range is input and the inverted selection signal SELB is activated, the second timing control signal generation circuit 215 may activate the second input timing control signal TCS<2>. The second timing control signal generation circuit 215 may be implemented with an inverter 215_1 and NAND gates 215_2 and 215_3.

FIG. 6 is a table for explaining the operation of the timing control signal generation circuit 109 illustrated in FIG. 5. The timing control signal generation circuit 109 may generate the input timing control signal TCS based on the frequency information signal FIS and the latency set information signal LSS. The first to Jth frequency information signals FIS<1:J> may indicate different frequencies, respectively, of the clock CLK. The frequencies of the clock CLK that are indicated by the (J-4)th, (J-3)th, and (J-2)th frequency information signals FIS<J-4>, FIS<J-3>, and FIS<J-2> may correspond to the first frequency range. The frequency of the clock CLK that is indicated by the Jth frequency information signal FIS<J> may correspond to the second frequency range. The second frequency range may be set higher than the first frequency range. The frequency of the clock CLK that is indicated by the (J-1)th frequency information signal FIS<J-1> may correspond to the third frequency range. The third frequency range may be set between the first frequency range and the second frequency range. The first to fifth latency set information signals LSS<1:5> may indicate the first latency set SET_A, the second latency set SET_B, the third latency set SET_C, the fourth latency set SET_D, and the fifth latency set SET_E, respectively.

When the frequency of the clock CLK that is indicated by the frequency information signal FIS does not correspond to the preset frequency range, the timing control signal generation circuit 109 may deactivate the first input timing control signal TCS<1> and the second input timing control signal TCS<2>.

When the frequency of the clock CLK that is indicated by the frequency information signal FIS corresponds to the preset first frequency range, the timing control signal generation circuit 109 may activate the first input timing control signal TCS<1>.

When the frequency of the clock CLK that is indicated by the frequency information signal FIS corresponds to the preset second frequency range, the timing control signal generation circuit 109 may activate the second input timing control signal TCS<2>.

When the frequency of the clock CLK that is indicated by the frequency information signal FIS corresponds to the preset third frequency range, the timing control signal generation circuit 109 may activate one of the first input timing control signal TCS<1> and the second input timing control signal TCS<2> based on the latency set that is indicated by the latency set information signal LSS. When the latency set that is indicated by the latency set information signal LSS is one of the first and second latency sets SET_A and SET_B, the timing control signal generation circuit 109 may activate the first input timing control signal TCS<1>. Conversely, when the latency set that is indicated by the latency set information signal LSS is one of the third, fourth, and fifth latency sets SET_C, SET_D, and SET_E, the timing control signal generation circuit 109 may activate the second input timing control signal TCS<2>.

Figure 7:
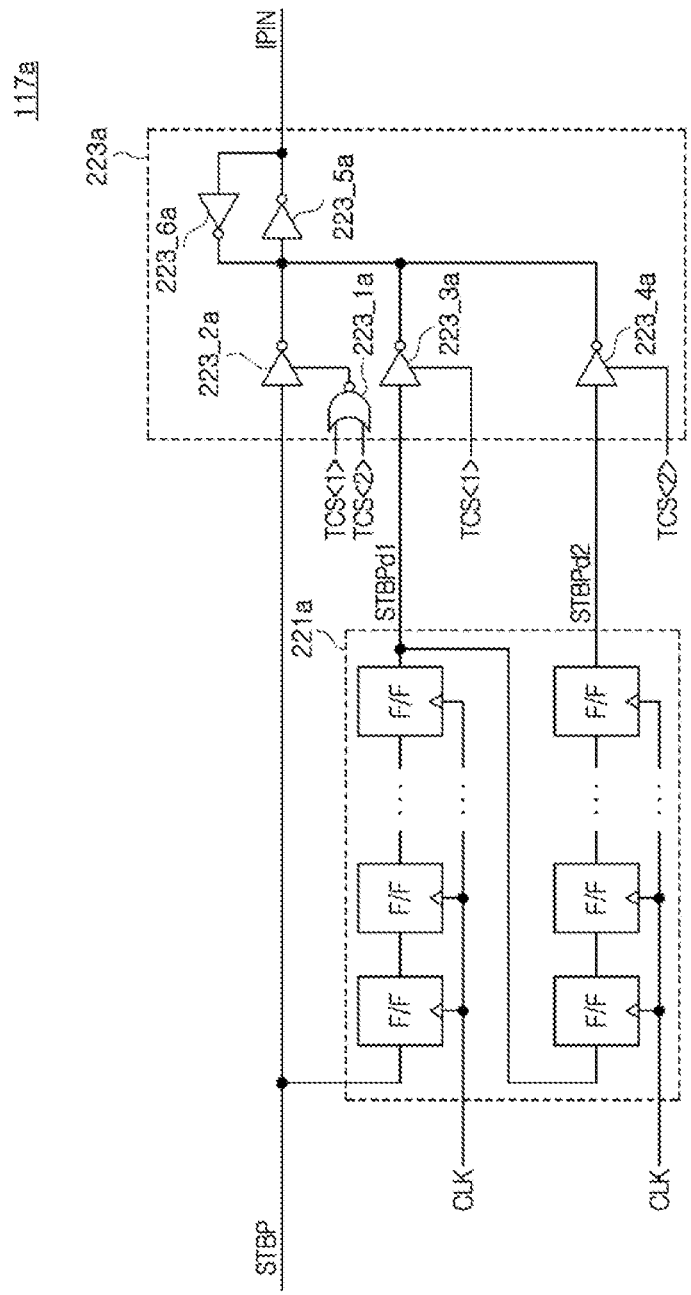
FIG. 7 is a circuit diagram illustrating an example of an internal input control signal generation circuit illustrated in FIG. 1.

FIG. 7 is a circuit diagram illustrating an example 117a of the internal input control signal generation circuit 117, illustrated in FIG. 1. As illustrated in FIG. 7, the internal input control signal generation circuit 117a may include a pulse delay circuit 221a and a control signal output circuit 223a.

The pulse delay circuit 221a may generate a first delayed strobing pulse STBPd1 and a second delayed strobing pulse STBPd2 by delaying the strobing pulse STBP in synchronization with the clock CLK. The pulse delay circuit 221a may output the first delayed strobing pulse STBPd1 by delaying the strobing pulse STBP by the first input delay period in synchronization with the clock CLK. For example, the pulse delay circuit 221a may output the first delayed strobing pulse STBPd1 by delaying the strobing pulse STBP by six cycles of the clock CLK. The pulse delay circuit 221a may output the second delayed strobing pulse STBPd2 by delaying the strobing pulse STBP by the second input delay period in synchronization with the clock CLK. For example, the pulse delay circuit 221a may output the second delayed strobing pulse STBPd2 by delaying the strobing pulse STBP by 12 cycles of the clock CLK. The pulse delay circuit 221a may be implemented with a plurality of flip-flops F/F each of which shifts and outputs an input signal in synchronization with the clock CLK.

The control signal output circuit 223a may output one of the strobing pulse STBP, the first delayed strobing pulse STBPd1, and the second delayed strobing pulse STBPd2 as the internal input control signal IPIN based on the first input timing control signal TCS<1> and the second input timing control signal TCS<2>. When both the first input timing control signal TCS<1> and the second input timing control signal TCS<2> are deactivated, the control signal output circuit 223a may output the strobing pulse STBP as the internal input control signal IPIN. When the first input timing control signal TCS<1> is activated, the control signal output circuit 223a may output the first delayed strobing pulse STBPd1 as the internal input control signal IPIN. When the second input timing control signal TCS<2> is activated, the control signal output circuit 223a may output the second delayed strobing pulse STBPd2 as the internal input control signal IPIN. The control signal output circuit 223a may be implemented with a NOR gate 223_1a and inverters 223_2a, 223_3a, 223_4a, 223_5a and 223_6a.

Figure 8:
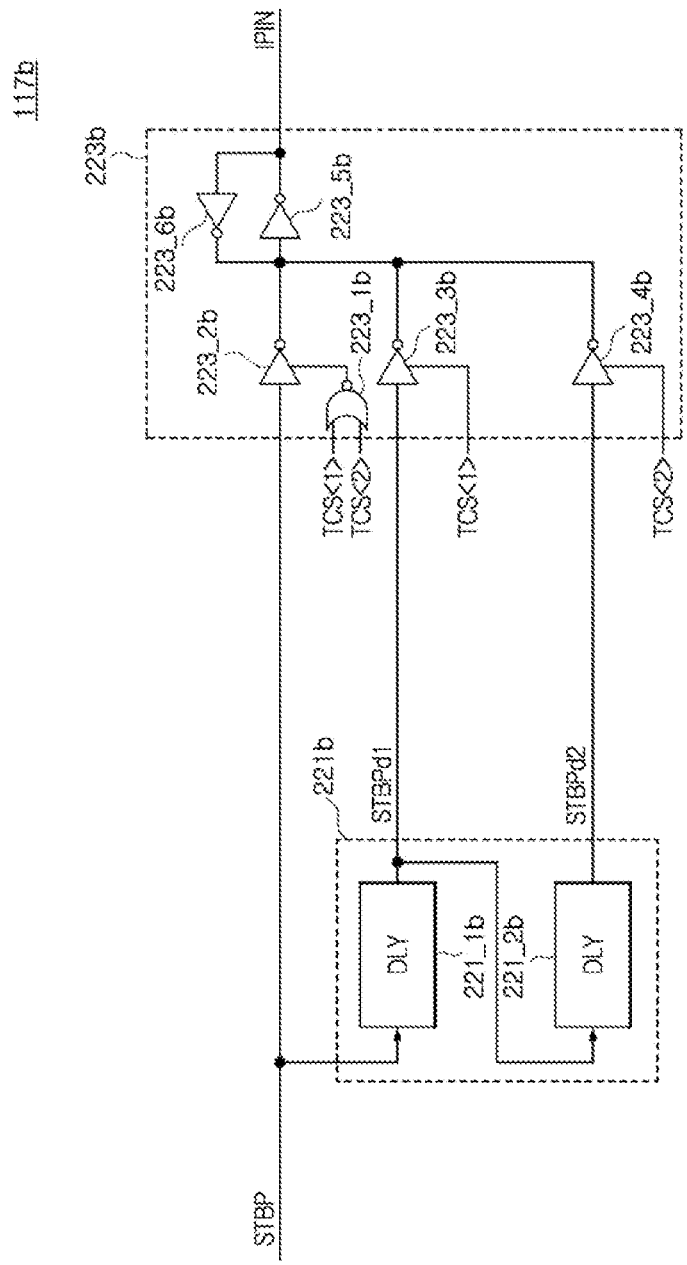
FIG. 8 is a circuit diagram illustrating another example of the internal input control signal generation circuit illustrated in FIG. 1.

FIG. 8 is a circuit diagram illustrating another example 117b of the internal input control signal generation circuit 117, illustrated in FIG. 1. As illustrated in FIG. 8, the internal input control signal generation circuit 117b may include a pulse delay circuit 221b and a control signal output circuit 223b.

The pulse delay circuit 221b may generate a first delayed strobing pulse STBPd1 and a second delayed strobing pulse STBPd2 by delaying the strobing pulse STBP. The pulse delay circuit 221b may include asynchronous delay circuits (DLY) 221_1b and 221_2b. Each of the asynchronous delay circuits 221_1b and 221_2b may be implemented with an RC delay circuit in which a resistor element and a capacitor are coupled and a delay circuit that is not synchronized with the clock CLK (see FIG. 7), such as an inverter chain in which a plurality of inverters are coupled in the form of a chain. The asynchronous delay circuit 221_1b may output the first delayed strobing pulse STBPd1 by delaying the strobing pulse STBP by the first input delay period. The asynchronous delay circuit 221_2b may output the second delayed strobing pulse STBPd2 by delaying the first delayed strobing pulse STBPd1 by the difference between the second input delay period and the first input delay period.

The control signal output circuit 223b may be implemented with a NOR gate 223_1b and inverters 223_2b, 223_3b, 223_4b, 223_5b, and 223_6b. The operation scheme of the control signal output circuit 223b is implemented in the same manner as that of the control signal output circuit 223a of FIG. 7.

Figure 9:
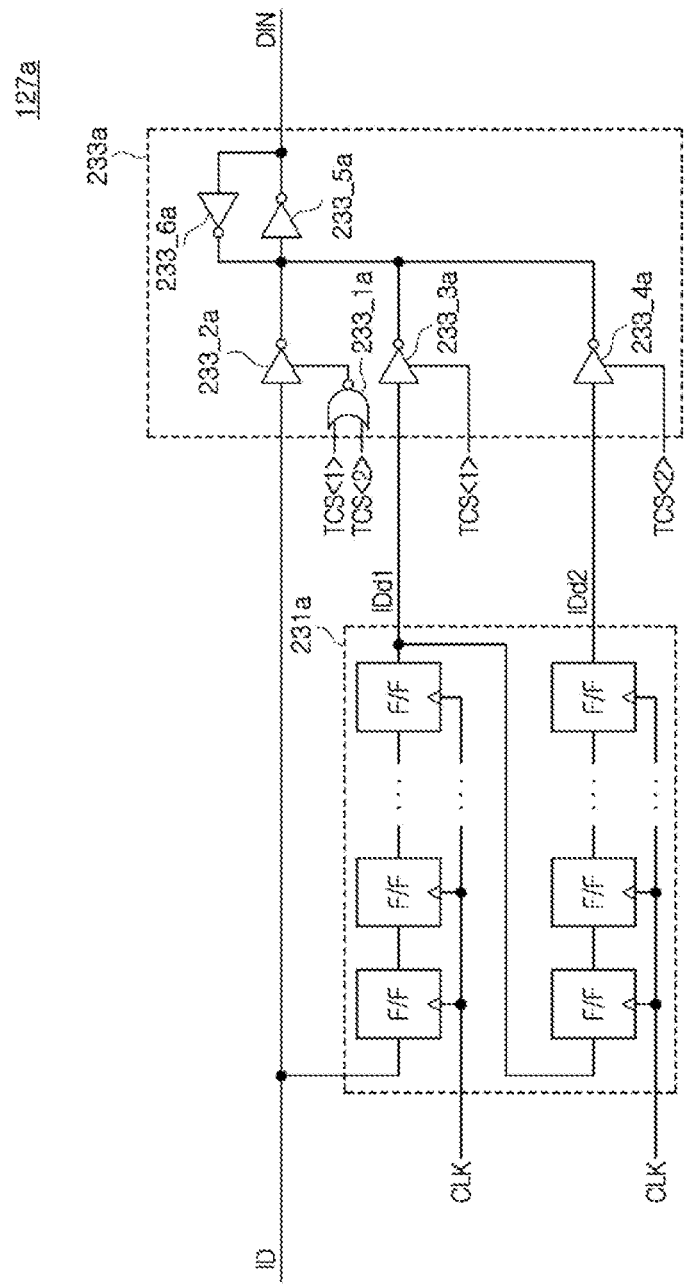
FIG. 9 is a circuit diagram illustrating an example of an input data generation circuit illustrated in FIG. 1.

FIG. 9 is a circuit diagram illustrating an example 127a of the input data generation circuit 127, illustrated in FIG. 1. As illustrated in FIG. 9, the input data generation circuit 127a may include a data delay circuit 231a and an input data output circuit 233a.

The data delay circuit 231a may generate first delayed data IDd1 and second delayed data IDd2 by delaying the internal data ID in synchronization with the clock CLK. The data delay circuit 231a may output the first delayed data IDd1 by delaying the internal data ID by the first input delay period in synchronization with the clock CLK. For example, the data delay circuit 231a may output the first delayed data IDd1 by delaying the internal data ID by six cycles of the clock CLK. The data delay circuit 231a may output the second delayed data IDd2 by delaying the internal data ID by the second input delay period in synchronization with the clock CLK. For example, the data delay circuit 231a may output the second delayed data IDd2 by delaying the internal data ID by 12 cycles of the clock CLK. The data delay circuit 231a may be implemented with a plurality of flip-flops F/F each of which shifts and outputs an input signal in synchronization with the clock CLK.

The input data output circuit 233a may output one of the internal data ID, the first delayed data IDd1, and the second delayed data IDd2 as the input data DIN based on the first input timing control signal TCS<1> and the second input timing control signal TCS<2>. When both the first input timing control signal TCS<1> and the second input timing control signal TCS<2> are deactivated, the input data output circuit 233a may output the internal data ID as the input data DIN. When the first input timing control signal TCS<1> is activated, the input data output circuit 233a may output the first delayed data IDd1 as the input data DIN. When the second input timing control signal TCS<2> is activated, the input data output circuit 233a may output the second delayed data IDd2 as the input data DIN. The input data output circuit 233a may be implemented with a NOR gate 233_1a and inverters 233_2a, 233_3a, 233_4a, 233_5a, and 233_6a.

Figure 10:
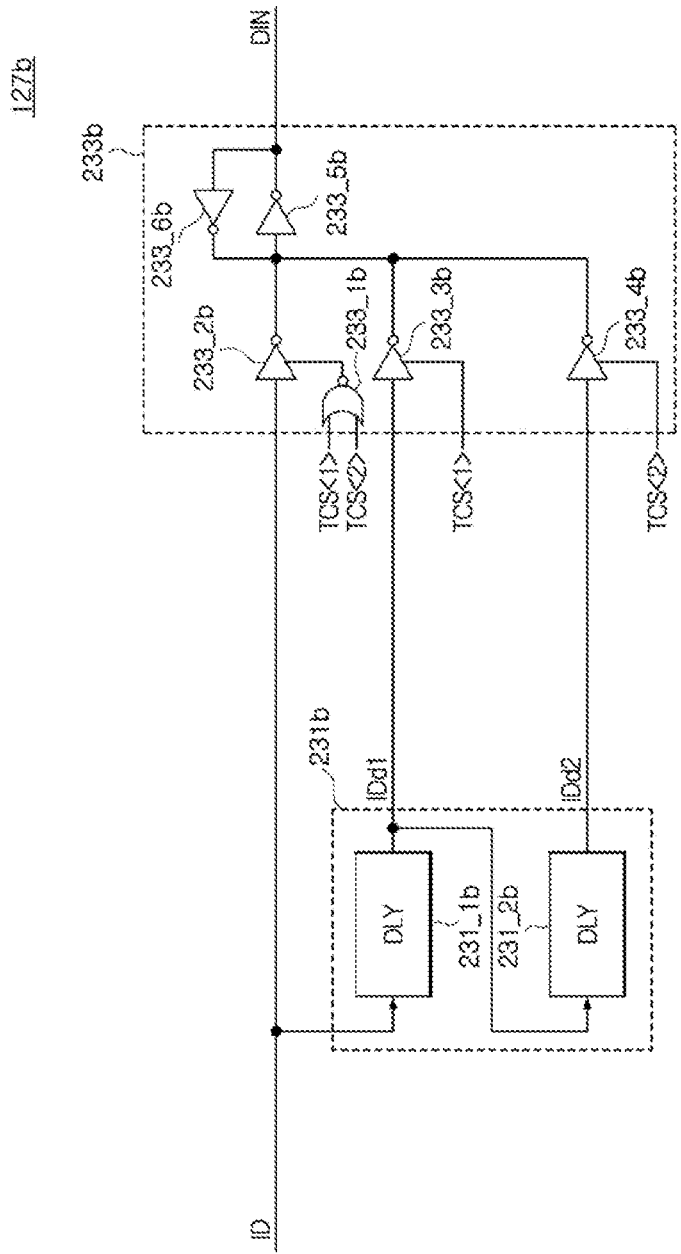
FIG. 10 is a circuit diagram illustrating another example of the input data generation circuit illustrated in FIG. 1.

FIG. 10 is a circuit diagram illustrating another example 127b of the input data generation circuit 127, illustrated in FIG. 1. As illustrated in FIG. 10, the input data generation circuit 127b may include a data delay circuit 231b and an input data output circuit 233b.

The data delay circuit 231b may generate first delayed data IDd1 and second delayed data IDd2 by delaying the internal data ID. The data delay circuit 231b may include asynchronous delay circuits (DLY) 231_1b and 231_2b. Each of the asynchronous delay circuits 231_1b and 231_2b may be implemented with an RC delay circuit in which a resistor element and a capacitor are coupled and a delay circuit that is not synchronized with the clock CLK (see FIG. 9), such as an inverter chain in which a plurality of inverters are coupled in the form of a chain. The data delay circuit 231b may output the first delayed data IDd1 by delaying the internal data ID by the first input delay period. The data delay circuit 231b may output the second delayed data IDd2 by delaying the first delayed data IDd1 by the difference between the second input delay period and the first input delay period.

The input data output circuit 233b may be implemented with a NOR gate 233_1b and inverters 233_2b, 233_3b, 233_4b, 233_5b and 233_6b. The operation scheme of the input data output circuit 233b is implemented in the same manner as that of the input data output circuit 233a of FIG. 9.

Figure 11:
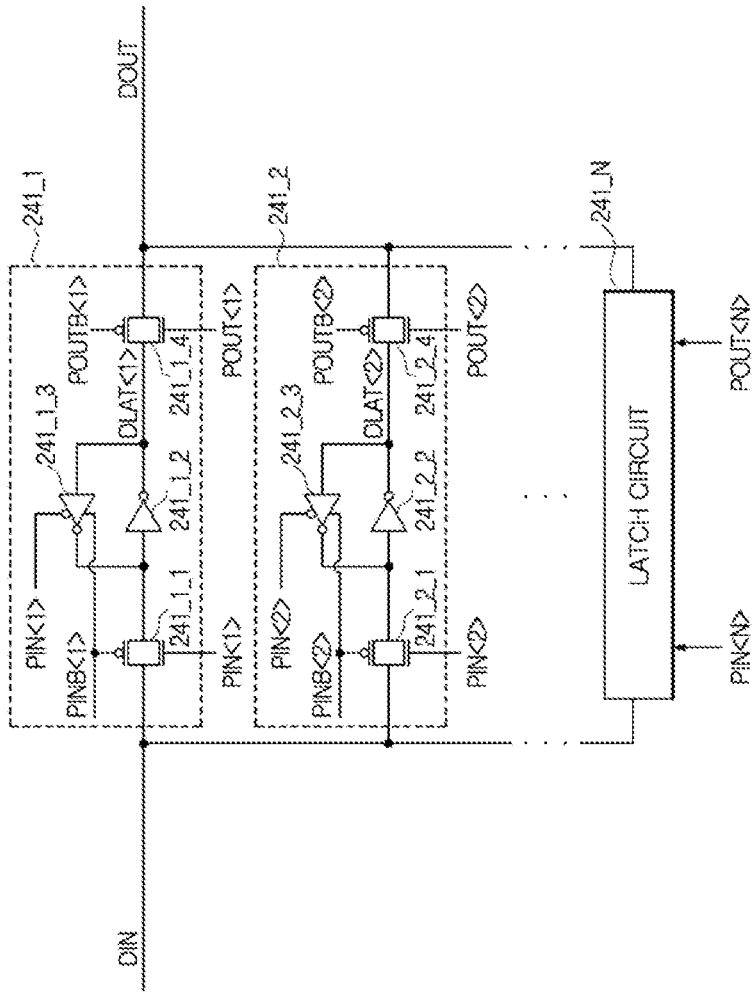
FIG. 11 is a diagram illustrating an example of a pipe latch circuit illustrated in FIG. 1.

FIG. 11 is a diagram illustrating an example of the pipe latch circuit 129, illustrated in FIG. 1. As illustrated in FIG. 11, the pipe latch circuit 129 may include the plurality of latch circuits (LATCH CIRCUIT) 241_1 to 241_N.

The first latch circuit 241_1 may generate first latch data DLAT<1> by latching the input data DIN when the first bit PIN<1> of the input control signal PIN is activated. The first latch circuit 241_1 may output the first latch data DLAT<1> as the output data DOUT when the first bit POUT<1> of the output control signal POUT is activated. The first latch circuit 241_1 may include transfer gates 241_1_1 and 241_1_4 and inverters 241_1_2 and 241_1_3. The transfer gate 241_1_1 may transfer the input data DIN to the input terminal of the inverter 241_1_2 when the first bit PIN<1> of the input control signal PIN is a logic high level and an inverted first bit PINB<1> of the input control signal PIN is a logic low level. The inverted first bit PINB<1> of the input control signal PIN may be generated by inverting the logic level of the first bit PIN<1> of the input control signal PIN. The inverter 241_1_2 may output the first latch data DLAT<1> by inverting and buffering the input data DIN input through the transfer gate 241_1_1. The inverter 241_1_3 may invert and buffer the first latch data DLAT<1> and output an output signal to the input terminal of the inverter 241_1_2. The inverter 241_1_3 may be enabled when the first bit PIN<1> of the input control signal PIN is a logic low level and the inverted first bit PINB<1> of the input control signal PIN is a logic high level. The transfer gate 241_1_4 may output the first latch data DLAT<1> as the output data DOUT when the first bit POUT<1> of the output control signal POUT is a logic high level and an inverted first bit POUTB<1> of the output control signal POUT is a logic low level. The inverted first bit POUTB<1> of the output control signal POUT may be generated by inverting the logic level of the first bit POUT<1> of the output control signal POUT.

The second latch circuit 241_2 may generate second latch data DLAT<2> by latching the input data DIN when the second bit PIN<2> of the input control signal PIN is activated. The second latch circuit 241_2 may output the second latch data DLAT<2> as the output data DOUT when the second bit POUT<2> of the output control signal POUT is activated. The second latch circuit 241_2 may include transfer gates 241_2_1 and 241_2_4 and inverters 241_2_2 and 241_2_3. The Nth latch circuit 241_N may generate Nth latch data (not illustrated) by latching the input data DIN when the Nth bit PIN<N> of the input control signal PIN is activated. The Nth latch circuit 241_N may output the Nth latch data (not illustrated) as the output data DOUT when the Nth bit POUT<N> of the output control signal POUT is activated. The operation scheme of the second to Nth latch circuits 241_2 to 241_N may be implemented in the same manner as that of the first latch circuit 241_1.

Figure 12:
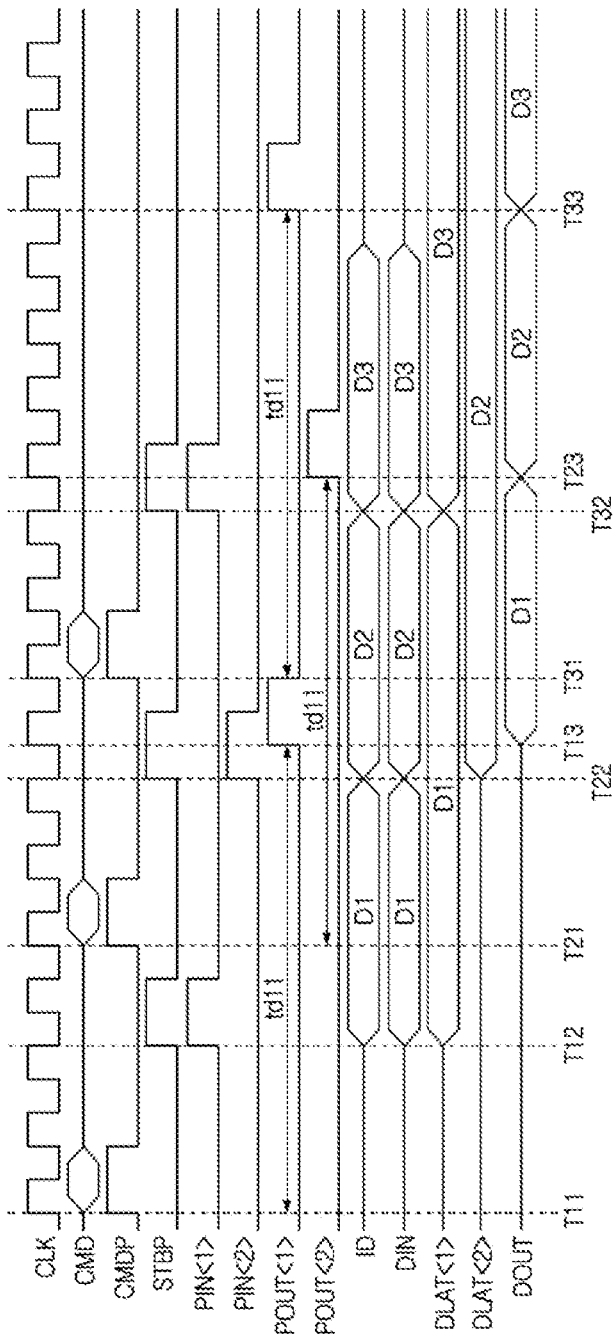
FIGS. 12 and 13 are timing diagrams for explaining internal operations performed in the semiconductor device illustrated in FIG. 1.

FIG. 12 is a timing diagram for explaining an internal operation performed in the semiconductor device 10 of FIG. 1 when the frequency of the clock CLK does not correspond to the preset frequency range. The timing control signal generation circuit 109 may deactivate the input timing control signal TCS when the frequency of the clock CLK does not correspond to the preset frequency range. A latency td11 that may be changed based on the frequency of the clock CLK corresponds to seven cycles of the clock CLK.

The command input circuit 111 may successively receive the command CMD for the internal operation, in synchronization with the clock CLK. The command input circuit 111 may generate the command pulse CMDP from the command CMD for the internal operation (T11, T21 and T31). The command input circuit 111 may generate the strobing pulse STBP from the command CMD for the internal operation (T12, T22 and T32).

When the strobing pulse STBP is input for the first time, the data storage circuit 113 may output the internal data ID with 'D1' (T12). When the strobing pulse STBP is input for the second time, the data storage circuit 113 may output the internal data ID with 'D2' (T22). When the strobing pulse STBP is input for the third time, the data storage circuit 113 may output the internal data ID with 'D3' (T32).

At T12, the internal input control signal generation circuit 117 may generate the internal input control signal IPIN by buffering the strobing pulse STBP based on the deactivated input timing control signal TCS. When the internal input control signal IPIN is input for the first time, the first count circuit 119 may activate the first bit PIN<1> of the input control signal PIN. The input data generation circuit 127 may generate the input data DIN with 'D1' by buffering the internal data ID based on the deactivated input timing control signal TCS. When the first bit PIN<1> of the input control signal PIN is activated, the pipe latch circuit 129 may generate the first latch data DLAT<1> by latching the input data DIN with 'D1.'

At T22, the internal input control signal generation circuit 117 may generate the internal input control signal IPIN by buffering the strobing pulse STBP based on the deactivated input timing control signal TCS. When the internal input control signal IPIN is input for the second time, the first count circuit 119 may activate the second bit PIN<2> of the input control signal PIN. The input data generation circuit 127 generates the input data DIN with 'D2' by buffering the internal data ID based on the deactivated input timing control signal TCS. When the second bit PIN<2> of the input control signal PIN is activated, the pipe latch circuit 129 may generate the second latch data DLAT<2> by latching the input data DIN with 'D2.'

At T13, the internal output control signal generation circuit 123 may generate the internal output control signal IPOUT by delaying the command pulse CMDP that is generated at T11 by the latency td11. When the internal output control signal IPOUT is input for the first time, the second count circuit 125 may activate the first bit POUT<1> of the output control signal POUT. When the first bit POUT<1> of the output control signal POUT is activated, the pipe latch circuit 129 may output the first latch data DLAT<1> with 'D1' as the output data DOUT.

At T32, the internal input control signal generation circuit 117 may generate the internal input control signal IPIN by buffering the strobing pulse STBP based on the deactivated input timing control signal TCS. When the internal input control signal IPIN is input for the third time, the first count circuit 119 may activate the first bit PIN<1> of the input control signal PIN again. The input data generation circuit 127 may generate the input data DIN with 'D3' by buffering the internal data ID based on the deactivated input timing control signal TCS. When the first bit PIN<1> of the input control signal PIN is activated again, the pipe latch circuit 129 may generate the first latch data DLAT<1> by latching the input data DIN with 'D3.' As the pipe latch circuit 129 first outputs the first latch data DLAT<1> with 'D1' at T13 before generating the first latch data DLAT<1> by latching the input data DIN with 'D3' at T32, it is possible to prevent a phenomenon in which the input data DIN is overwritten to the first latch data DLAT<1>.

At T23 and T33, the pipe latch circuit 129 may sequentially output the second latch data DLAT<2> with 'D2' and the first latch data DLAT<1> with 'D3' as the output data DOUT, as at T13.

Figure 13:
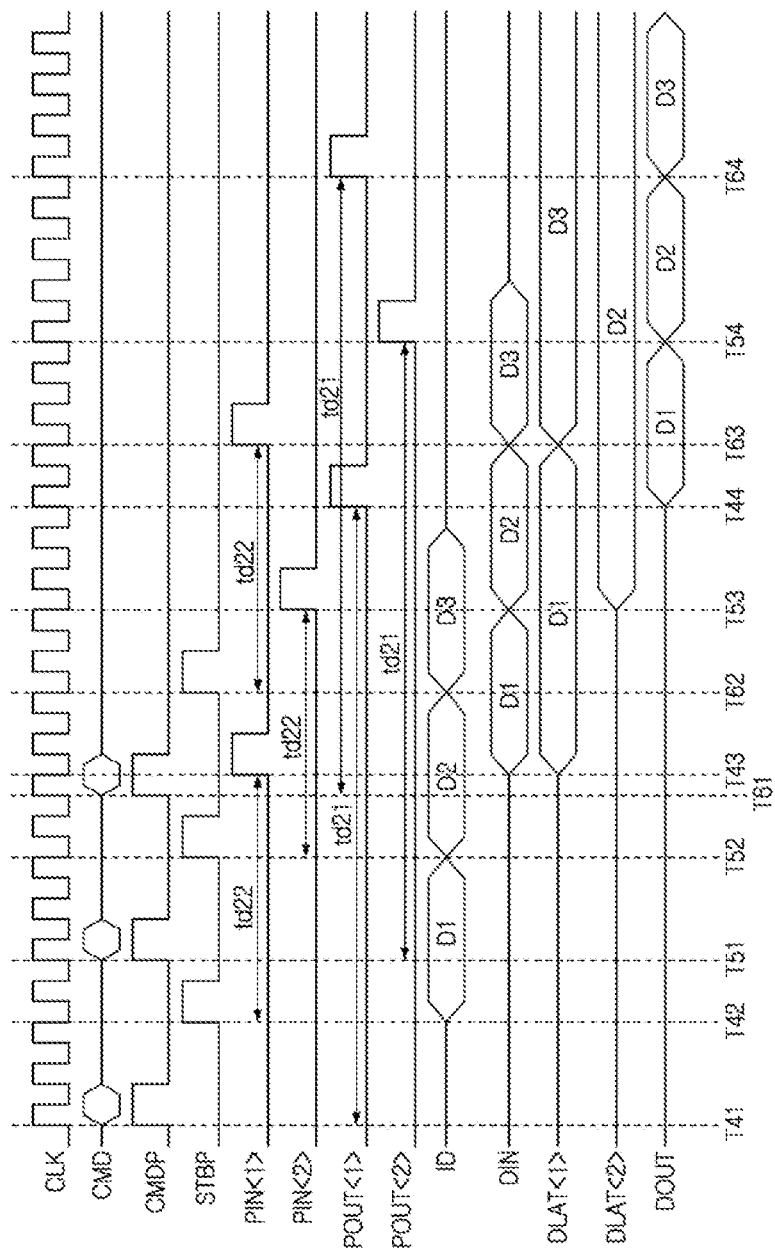

FIG. 13 is a timing diagram for explaining an internal operation performed in the semiconductor device 10 of FIG. 1 when the frequency of the clock CLK corresponds to the preset frequency range. The timing control signal generation circuit 109 may activate the input timing control signal TCS when the frequency of the clock CLK corresponds to the preset frequency range. A latency td21 that may be changed based on the frequency of the clock CLK corresponds to 15 cycles of the clock CLK.

The command input circuit 111 may successively receive the command CMD for the internal operation, in synchronization with the clock CLK. The command input circuit 111 may generate the command pulse CMDP from the command CMD for the internal operation (T41, T51 and T61). The command input circuit 111 may generate the strobing pulse STBP from the command CMD for the internal operation (T42, T52 and T62).

When the strobing pulse STBP is input for the first time, the data storage circuit 113 may output the internal data ID with 'D1' (T42). When the strobing pulse STBP is input for the second time, the data storage circuit 113 may output the internal data ID with 'D2' (T52). When the strobing pulse STBP is input for the third time, the data storage circuit 113 may output the internal data ID with 'D3' (T62).

At T43, the internal input control signal generation circuit 117 may generate the internal input control signal IPIN by delaying the strobing pulse STBP that is generated at T42 by an input delay period td22 based on the activated input timing control signal TCS. When the internal input control signal IPIN is input for the first time, the first count circuit 119 activates the first bit PIN<1> of the input control signal PIN. The input data generation circuit 127 may generate the input data DIN by delaying the internal data ID with 'D1' by the input delay period td22 based on the activated input timing control signal TCS. When the first bit PIN<1> of the input control signal PIN is activated, the pipe latch circuit 129 may generate the first latch data DLAT<1> by latching the input data DIN with 'D1.'

At T53, the internal input control signal generation circuit 117 may generate the internal input control signal IPIN by delaying the strobing pulse STBP that is generated at T52 by the input delay period td22 based on the activated input timing control signal TCS. When the internal input control signal IPIN is input for the second time, the first count circuit 119 may activate the second bit PIN<2> of the input control signal PIN. The input data generation circuit 127 may generate the input data DIN by delaying the internal data ID with 'D2' by the input delay period td22 based on the activated input timing control signal TCS. When the second bit PIN<2> of the input control signal PIN is activated, the pipe latch circuit 129 may generate the second latch data DLAT<2> by latching the input data DIN with 'D2.'

At T44, the internal output control signal generation circuit 123 may generate the internal output control signal IPOUT by delaying the command pulse CMDP that is generated at T41 by the latency td21. When the internal output control signal IPOUT is input for the first time, the second count circuit 125 may activate the first bit POUT<1> of the output control signal POUT. When the first bit POUT<1> of the output control signal POUT is activated, the pipe latch circuit 129 may output the first latch data DLAT<1> with 'D1' as the output data DOUT.

At T63, the internal input control signal generation circuit 117 may generate the internal input control signal IPIN by delaying the strobing pulse STBP by the input delay period td22 based on the activated input timing control signal TCS. When the internal input control signal IPIN is input for the third time, the first count circuit 119 may activate the first bit PIN<1> of the input control signal PIN again. The input data generation circuit 127 may generate the input data DIN by delaying the internal data ID with 'D3' by the input delay period td22 based on the activated input timing control signal TCS. When the first bit PIN<1> of the input control signal PIN is activated again, the pipe latch circuit 129 may generate the first latch data DLAT<1> by latching the input data DIN with 'D3.' As the pipe latch circuit 129 first outputs the first latch data DLAT<1> with 'D1' at T44 before generating the first latch data DLAT<1> by latching the input data DIN with 'D3' at T63, it is possible to prevent a phenomenon in which the input data DIN is overwritten to the first latch data DLAT<1>.

At T54 and T64, the pipe latch circuit 129 may sequentially output the second latch data DLAT<2> with 'D2' and the first latch data DLAT<1> with 'D3' as the output data DOUT, as at T44.

As is apparent from the above description, according to the examples of the present disclosure, when a time point at which data that is latched in a pipe latch circuit is output is changed based on a clock frequency, by adjusting a time point at which data is input to the pipe latch circuit, based on whether the clock frequency corresponds to a preset frequency range, it is possible to prevent overwriting regardless of clock frequency, and it is possible to reduce an output loading that increases as the number of latch circuits that are included in the pipe latch circuit increases.

Although some examples of the present teachings have been disclosed for illustrative purposes, those skilled in the art will appreciate that various modifications, additions and substitutions are possible, without departing from the scope and spirit of the present teachings as defined in the accompanying claims.

What is claimed is:

1. A semiconductor device comprising:
an input control signal generation circuit configured to generate an input control signal when performing an internal operation and configured to adjust a time point at which the input control signal is generated, based on whether a frequency of a clock corresponds to a preset frequency range;
an output control signal generation circuit configured to generate an output control signal after a latency elapses when performing the internal operation; and
a pipe latch circuit configured to latch input data based on the input control signal and configured to output the latched input data as output data based on the output control signal.

2. The semiconductor device according to claim 1, wherein the input control signal generation circuit is configured to generate the input control signal from a strobing pulse for the internal operation based on an input timing control signal, and
   wherein the input timing control signal is activated when a frequency of the clock corresponds to the preset frequency range.

3. The semiconductor device according to claim 2, wherein, when the input timing control signal is activated, the input control signal generation circuit generates the input control signal by further delaying the strobing pulse by an input delay period.

4. The semiconductor device according to claim 3, wherein the input control signal generation circuit adjusts the input delay period to a larger degree when a second input timing control signal is activated compared to when a first input timing control signal is activated, and
   wherein the input timing control signal includes the first input timing control signal and the second input timing control signal.

5. The semiconductor device according to claim 4, further comprising:
   a timing control signal generation circuit configured to activate the first input timing control signal when a frequency of the clock that is indicated by a frequency information signal corresponds to a preset first frequency range and configured to activate the second input timing control signal when a frequency of the clock that is indicated by the frequency information signal corresponds to a preset second frequency range, the second frequency range being set higher than the first frequency range.

6. The semiconductor device according to claim 5, wherein when a frequency of the clock that is indicated by the frequency information signal corresponds to a preset third frequency range, the timing control signal generation circuit activates one of the first and second input timing control signals according to a latency set that is indicated by a latency set information signal, and the third frequency range is set between the first frequency range and the second frequency range.

7. The semiconductor device according to claim 6, further comprising:
   a latency set information signal generation circuit configured to generate the latency set information signal based on a mode enable signal, the mode enable signal being activated to perform a mode that is related to at least one of data calculation, data error information transmission, and data transfer in the internal operation.

8. The semiconductor device according to claim 2, further comprising:
   an input data generation circuit configured to generate, when the input timing control signal is activated, the input data by further delaying internal data by an input delay period.

9. The semiconductor device according to claim 8, further comprising:
   a data storage circuit, including a cell array that stores the internal data, configured to output the internal data, stored in the cell array, when the strobing pulse is input.

10. The semiconductor device according to claim 8, wherein the input data generation circuit adjusts the input delay period to a larger degree when a second input timing control signal is activated than when a first input timing control signal is activated, and the input timing control signal includes the first input timing control signal and the second input timing control signal.

11. The semiconductor device according to claim 1, wherein the output control signal generation circuit generates the output control signal by delaying a command pulse for the internal operation by the latency based on a latency signal, and the latency signal indicates the latency that is changed according to a frequency of the clock.

12. The semiconductor device according to claim 11, further comprising:
   a latency signal generation circuit configured to generate the latency signal for indicating the latency that is changed based on a frequency information signal, a frequency ratio information signal, and a latency set information signal, the frequency information signal indicating the frequency of the clock, the frequency ratio information signal indicating a frequency ratio between the clock and a data clock, and the latency set information signal indicating a latency set.

13. The semiconductor device according to claim 1, wherein
   the input control signal generation circuit sequentially activates bits of the input control signal by counting an input of a strobing pulse for the internal operation, and
   wherein the output control signal generation circuit sequentially activates bits of the output control signal by counting an input of a command pulse for the internal operation.

14. The semiconductor device according to claim 13, wherein the pipe latch circuit comprises:
   a first latch circuit configured to generate first latch data by latching the input data when a first bit of the input control signal is activated and configured to output the first latch data as the output data when a first bit of the output control signal is activated; and
   a second latch circuit configured to generate second latch data by latching the input data when a second bit of the input control signal is activated and configured to output the second latch data as the output data when a second bit of the output control signal is activated.

15. A semiconductor device comprising:
   an input data generation circuit configured to generate input data when performing an internal operation and configured to adjust a time point at which the input data is generated, based on whether a frequency of a clock corresponds to a preset frequency range;
   a first latch circuit configured to generate first latch data by latching the input data based on a first bit of an input control signal and configured to output the first latch data as output data based on a first bit of an output control signal; and
   a second latch circuit configured to generate second latch data by latching the input data based on a second bit of the input control signal and configured to output the second latch data as the output data based on a second bit of the output control signal.

16. The semiconductor device according to claim 15, wherein the input data generation circuit is configured to generate the input data from internal data based on an input timing control signal, and
   wherein the input timing control signal is activated when a frequency of the clock corresponds to the preset frequency range.

17. The semiconductor device according to claim 16, wherein the input data generation circuit comprises:
   a data delay circuit configured to output first delayed data by delaying the internal data by a first input delay period and configured to output second delayed data by delaying the internal data by a second input delay period; and an input data output circuit configured to output one of the internal data, the first delayed data, and the second delayed data as the input data based on the input timing control signal.

18. The semiconductor device according to claim 16, further comprising:

an input control signal generation circuit configured to generate first and second bits of the input control signal from a strobing pulse based on the input timing control signal when performing the internal operation.

19. The semiconductor device according to claim 18, wherein the input control signal generation circuit comprises:

a pulse delay circuit configured to output a first delayed strobing pulse by delaying the strobing pulse by a first input delay period and configured to output a second delayed strobing pulse by delaying the strobing pulse by a second input delay period;

a control signal output circuit configured to output one of the strobing pulse, the first delayed strobing pulse, and the second delayed strobing pulse as an internal input control signal based on the input timing control signal; and a first count circuit configured to sequentially activate the first and second bits of the input control signal by counting an input of the internal input control signal.

20. The semiconductor device according to claim 15, further comprising:

an internal output control signal generation circuit configured to, when performing the internal operation, generate an internal output control signal after a latency, changed according to a frequency of the clock, elapses; and a second count circuit configured to sequentially activate first and second bits of the output control signal by counting an input of the internal output control signal.

* * * * *